United States Patent
Kim et al.

(10) Patent No.: US 9,230,634 B2
(45) Date of Patent: Jan. 5, 2016

(54) REFRESH SCHEME FOR MEMORY CELLS WITH NEXT BIT TABLE

(71) Applicant: QUALCOMM Incorporated, San Diego, CA (US)

(72) Inventors: Jung Pill Kim, San Diego, CA (US); Jungwon Suh, San Diego, CA (US); Xiangyu Dong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 116 days.

(21) Appl. No.: 14/276,452

(22) Filed: May 13, 2014

(65) Prior Publication Data

US 2015/0162065 A1    Jun. 11, 2015

Related U.S. Application Data

(60) Provisional application No. 61/913,788, filed on Dec. 9, 2013.

(51) Int. Cl.
*G06F 12/00*     (2006.01)
*G11C 11/406*    (2006.01)
*G06F 12/02*     (2006.01)

(52) U.S. Cl.
CPC .......... *G11C 11/406* (2013.01); *G06F 12/0207* (2013.01); *G11C 11/40615* (2013.01); *G11C 11/40618* (2013.01); *G11C 11/40622* (2013.01); *G11C 2211/4061* (2013.01); *G11C 2211/4065* (2013.01)

(58) Field of Classification Search
CPC .............. G06F 12/0207; G11C 11/406; G11C 11/40618
See application file for complete search history.

(56) References Cited

U.S. PATENT DOCUMENTS

| 7,020,038 | B2 | 3/2006 | Shieh |
| 2011/0069572 | A1 | 3/2011 | Lee et al. |
| 2012/0300568 | A1* | 11/2012 | Park ................. G11C 11/40618 365/222 |
| 2013/0170274 | A1 | 7/2013 | Yu et al. |
| 2013/0176768 | A1 | 7/2013 | Wang |
| 2013/0282973 | A1 | 10/2013 | Kim et al. |
| 2013/0308405 | A1 | 11/2013 | Jeong |
| 2014/0016422 | A1 | 1/2014 | Kim et al. |

FOREIGN PATENT DOCUMENTS

DE    102012203610 A1    11/2012

OTHER PUBLICATIONS

International Search Report and Written Opinion—PCT/US2014/066726—ISA/EPO—Mar. 10, 2015.

* cited by examiner

*Primary Examiner* — Shawn X Gu
(74) *Attorney, Agent, or Firm* — Seyfarth Shaw LLP

(57) ABSTRACT

A memory refresh control technique allows flexible internal refresh rates based on an external 1× refresh rate and allows skipping a refresh cycle for strong memory rows based on the external 1× refresh rate. A memory controller performs a memory refresh by reading a refresh address from a refresh address counter, reading a weak address from a weak address table and generating a next weak address value based at least in part on a next bit sequence combined with the weak address. The memory controller compares the refresh address to the weak address and to the next weak address value. Based on the comparison, the memory controller selects between skipping a refresh cycle, refreshing the refresh address, refreshing the weak address, and refreshing both the refresh address and the weak address.

20 Claims, 8 Drawing Sheets

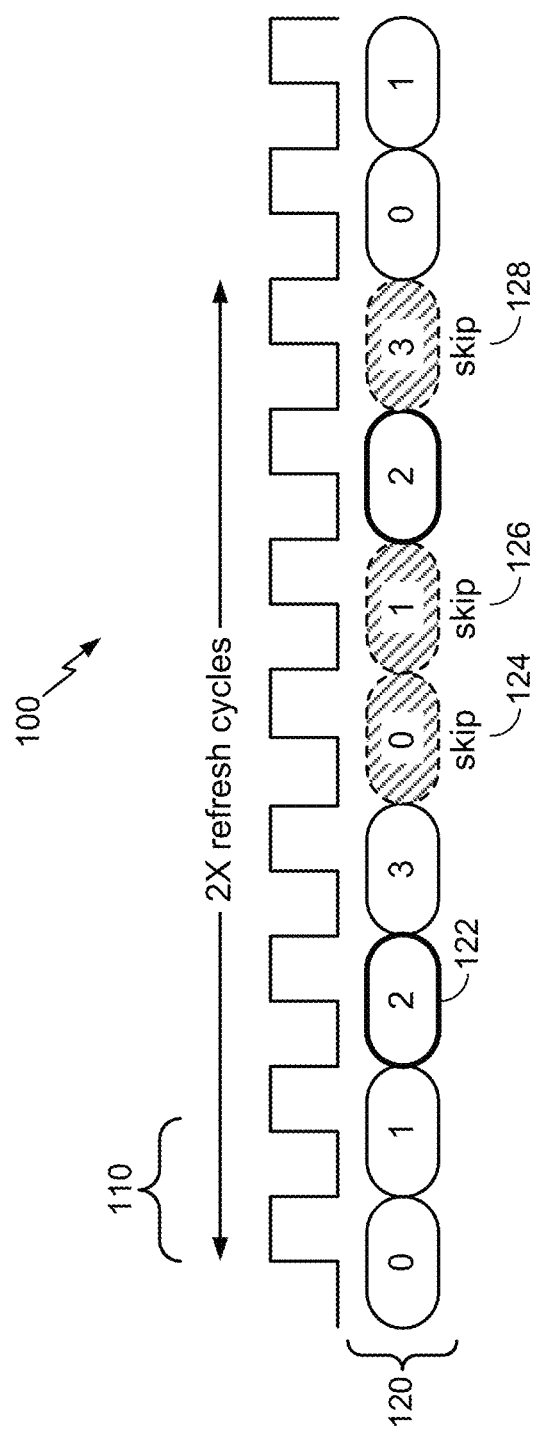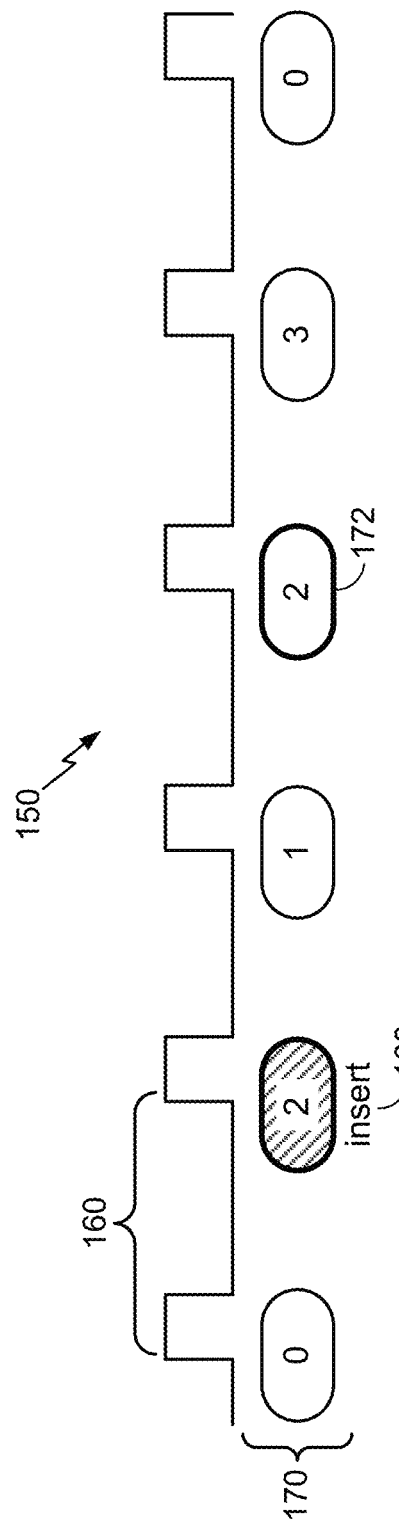

REFRESH SCHEME FOR MEMORY CELLS WITH NEXT BIT TABLE

CROSS-REFERENCE TO RELATED APPLICATIONS

This application claims the benefit of U.S. Provisional Patent Application No. 61/913,788, entitled "REFRESH SCHEME FOR MEMORY CELLS WITH NEXT BIT TABLE," filed on Dec. 9, 2013, which is incorporated herein by reference in its entirety.

TECHNICAL FIELD

This disclosure relates to electronic memory operation and more specifically to a refresh scheme for memory cells with a weak retention time.

BACKGROUND

Semiconductor memory devices include, for example, static random access memory (SRAM) and dynamic random access memory (DRAM). A DRAM memory cell generally includes one transistor and one capacitor, thereby providing a high degree of integration. The capacitor can be either charged or discharged to store information as a corresponding bit value (e.g., 0 or 1). Because capacitors leak charge, the stored information eventual fades unless the capacitor charge is refreshed periodically. Due to the refresh requirement, DRAM is referred to as dynamic memory as opposed to SRAM and other static memory. The continuous refreshing of DRAM generally limits its use to computer main memory.

DRAM scaling continues to increase the total number of bits for each DRAM chip, directly impacting the specification of DRAM refresh, the process by which a cell's value is kept readable. The specification of DRAM refresh includes the interval at which refresh commands are sent to each DRAM (tREFI) and the amount of time that the refresh command occupies the DRAM interface (tRFC). Unfortunately, DRAM scaling increases the number of weak retention cells (e.g., cells that have a reduced retention time). Such cells involve additional refresh cycles to maintain the stored information. A significant performance and power consumption impact is caused by the increased refresh cycles in a system on chip or other like computer architecture. Otherwise, potential DRAM chip yield loss results without increased refresh cycles.

SUMMARY

A memory refresh method within a memory controller may include reading a refresh address from a refresh address counter, and reading a weak address from a weak address table. The method also includes generating a next weak address value based at least in part on a next bit sequence combined with the weak address, and comparing the refresh address to the weak address and to the next weak address value. The method further includes selecting between skipping a refresh cycle, refreshing the refresh address, refreshing the weak address, and refreshing both the refresh address and the weak address. The selecting is based at least in part on the comparison of the refresh address to the weak address and to the next weak address value.

A memory refresh apparatus may include a refresh counter operable to store a refresh address, and a weak address table operable to store a weak address. The apparatus further includes a next bit table operable to generate the next weak address based at least in part on next bit values in the next bit table combined with the weak address. The apparatus also includes a refresh controller operable to select between skipping a refresh cycle, refreshing the refresh address, refreshing the weak address, and refreshing both the refresh address and the weak address. The refresh controller makes this selection based at least in part on comparing the refresh address to the weak address and to the next weak address.

A memory controller apparatus may include a refresh counter to store a refresh address, and a weak address table to store a weak address. The apparatus further includes a next bit table to generate the next weak address based at least in part on next bit values in the next bit table combined with the weak address. The apparatus also includes means for selecting between skipping a refresh cycle, refreshing the refresh address, refreshing the weak address, and refreshing both the refresh address and the weak address based at least in part on comparing the refresh address to the weak address and to the next weak address.

Another aspect of the present disclosure includes a computer program product for a memory refresh in which a non-transitory computer-readable medium has program code recorded thereon. The program code includes program code to store a refresh address in a refresh counter, program code to store a weak address in a weak address table, and program code to generate the next weak address based at least in part on next bit values in a next bit table combined with the weak address. The program code also includes program code to select between skipping a refresh cycle, refreshing the refresh address, refreshing the weak address, and refreshing both the refresh address and the weak address based at least in part on comparing the refresh address to the weak address and to the next weak address.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

FIGS. 1A and 1B illustrate circuit timing diagrams that show techniques for increasing a refresh frequency of memory cells with a weak retention state, while maintaining a refresh frequency for other memory cells, according to aspects of the present disclosure.

DETAILED DESCRIPTION

Figures 2A, 2B:
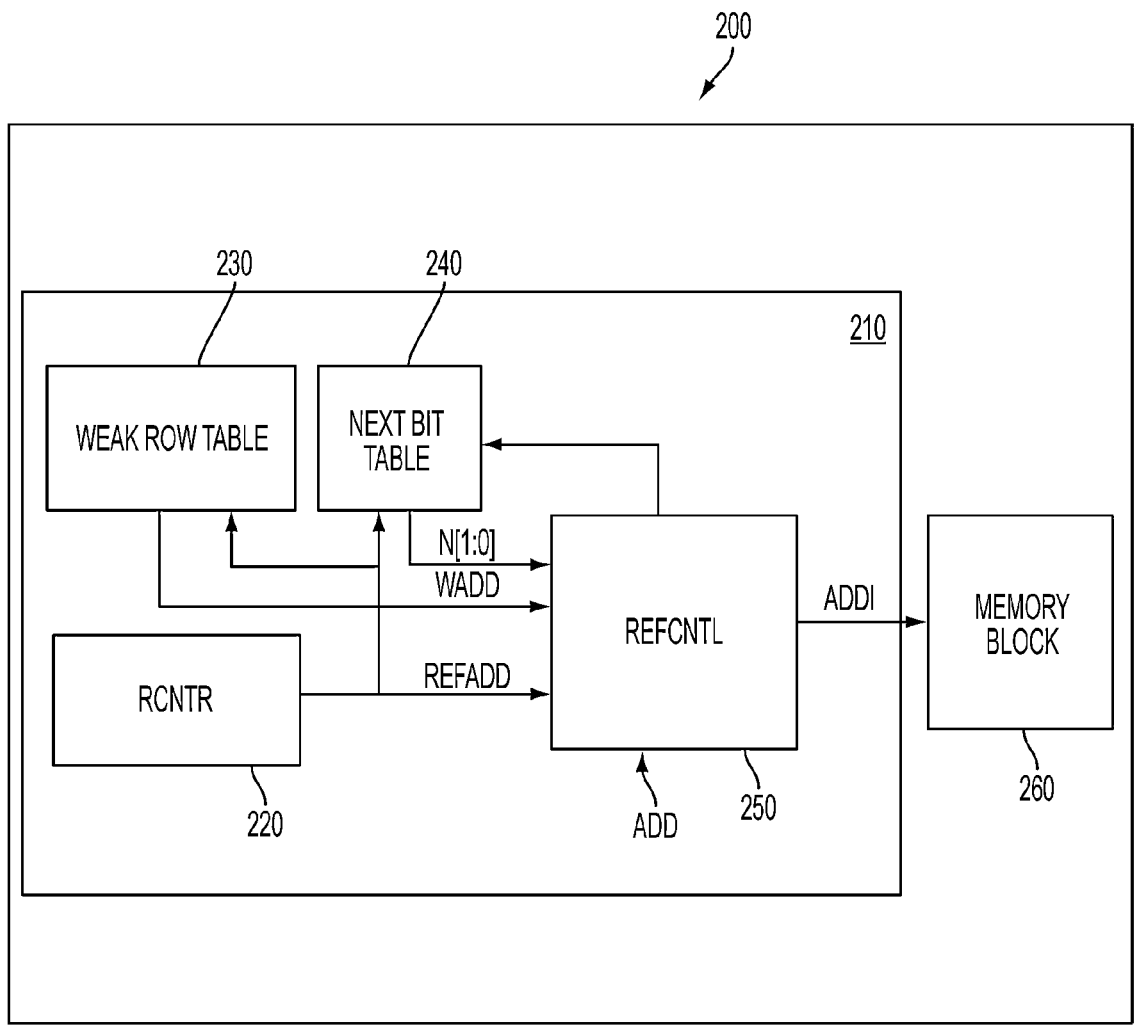
FIG. 2A is a block diagram illustrating a memory controller including a refresh control block according to an aspect of the present disclosure.
FIG. 2B illustrates a refresh table to provide a memory address having a weak retention state according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Dynamic random access memory (DRAM) scaling continues to increase the total number of bits per DRAM chip. This increased capacity directly impacts the specification of DRAM refresh, the process by which a bit cell's value is kept readable. The specification of DRAM refresh includes the interval at which refresh commands are sent to each DRAM (tREFI), and the amount of time that the refresh command occupies the DRAM interface (tRFC). Unfortunately, DRAM scaling also increases the number of weak retention cells (e.g., cells that have a reduced retention time). Such cells involve increased refresh cycles to maintain the stored information. Performance and power consumption are significantly impacted by the increased refresh cycles on a DRAM in a system on chip (SoC) or other like computer architecture. Potential DRAM chip yield loss from the increased number of weak retention cells results without the increased refresh cycles.

One aspect of the present disclosure inserts a refresh cycle for cells with a weak retention state, with a nominal increase to the refresh period (e.g., the refresh interval tREFI). In one configuration, a refresh controller may select between inserting a refresh operation for weak cell and/or skipping a refresh cycle for strong cells. In this configuration, the refresh controller select between skipping a refresh cycle, refreshing a refresh address, refreshing a weak address, and refreshing both the refresh address and the weak address based at least in part on comparing the refresh address to a weak address and to a next weak address.

FIGS. 1A and 1B illustrate circuit timing diagrams that show existing techniques for increasing a refresh frequency of memory cells (e.g., rows) with a weak retention state, while maintaining a refresh frequency for other memory cells. FIG. 1A shows a timing diagram 100 with a double refresh cycle 110 for performing refresh operations on refresh addresses 120. The double refresh cycle 110 may be, for example, sixteen (16) milliseconds (ms) in case of a thirty two (32) milliseconds (ms) refresh specification. In this example, there are four rows of memory, with a refresh address 122 having a weak retention state. Representatively, refresh operations are performed on refresh addresses zero (0), one (1), two (2) and three (3). In this example, however, refresh operations on the refresh address 124, the refresh address 126 and the refresh address 128 are skipped during a subsequent pass. As shown in FIG. 1A, the refresh cycle is doubled for the refresh address 122 having the weak retention state, while skipping the refresh cycles for the refresh addresses with a normal retention state.

FIG. 1B shows a desired timing diagram 150 with a single refresh cycle 160 for performing refresh operation on refresh addresses 170. The single refresh cycle 160 may be, for example, thirty-two (32) milliseconds (ms). In this example, there are also four rows of memory, with a refresh address 172 having a weak retention state. Representatively, an inserted refresh operation 180 is performed on the refresh address 172 with the weak retention state. In this example, weak row refresh cycles are inserted. As shown in FIG. 1B, the refresh cycle is doubled for only the refresh address 172 with the weak retention state, while maintaining the refresh cycle for the refresh addresses with a normal retention state. Although refresh interval (tREFI) slightly increases due to the increased refreshes, the number of weak cells is very small relative to the number of normal cells. Because of its smaller interval increase, the refresh cycle shown in FIG. 1B may be favorable compared to the refresh cycle shown in FIG. 1A.

Existing refresh schemes that are limited to providing a double (2×) refresh rate for weak memory cells based on an external (1×) refresh rate waste memory resources in certain circumstances. For example, resources may be conserved in circumstances where a 1.5× refresh rate or some other refresh rate may be more suitable than a 2× refresh rate for refreshing certain weak memory cells.

One aspect of the present disclosure include a memory refresh control technique that allows flexible internal refresh rates based on an external 1× refresh rate. Another aspect of the present disclosure includes a memory refresh control technique that allows skipping a refresh cycle for strong memory rows based on an external 1× refresh rate.

FIG. 2A is a block diagram illustrating a memory controller 200 including a refresh control block 210 coupled to a memory block 260, according to an aspect of the present disclosure. In this configuration, the refresh control block 210 includes a refresh counter 220, a weak row table 230, a NEXT BIT table 240 and refresh control logic 250. The weak row table 230, which is further illustrated in FIG. 2B, includes only the memory addresses (e.g., weak addresses (WADD)) with a corresponding weak retention state.

The NEXT BIT table 240 corresponds to the weak row table 230. The NEXT BIT table 240 is a data structure, according to aspects of the present disclosure, to implement a 1.5× refresh rate or a 2× refresh rate for a corresponding weak row. The refresh control logic 250 determines which should be the next row to refresh. The NEXT BIT table 240 implements the appropriate refresh rate by determining where in the refresh sequence to insert a row refresh.

Figure 3A:
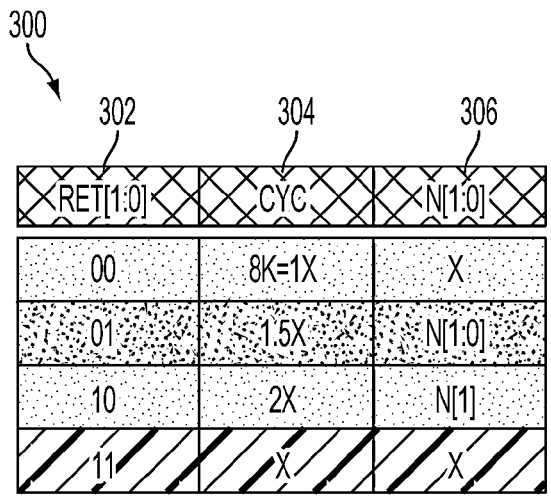
FIG. 3A is a table illustrating the use of retention bits to indicate a corresponding refresh rate and corresponding NEXT BITS for generating a next weak address for the corresponding refresh rate.

FIG. 3A is a table 300 containing pre-programmed retention bits 302 corresponding to entries in the weak row table 230 (FIG. 2B). The pre-programmed retention bits 302 define the refresh rate 304 to be applied to each respective row listed in the weak row table 230 (FIG. 2B). The pre-programmed retention bits 302 may be pre-programmed based on whether a row is a normal row or a weak row and whether the weak row should be subject to a 2× refresh rate or a 1.5× refresh rate. In a retention bit table, according to this aspect of the present disclosure, retention bit values 00 indicate a normal refresh at the external 1× refresh rate; retention bit values of 01 indicate a 1.5× refresh rate to be applied to a weak row of memory cells; and retention bit values of 10 indicate a 2× refresh rate to be applied to a weak row of memory cells. In this example, retention bit values of 11 indicate a non-available refresh rate or an alternative refresh rate to be applied to a corresponding row of memory cells.

Figure 3B:
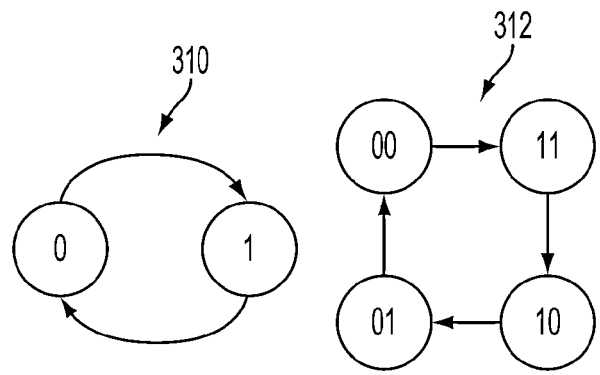
FIGS. 3B and 3C are conceptual diagrams showing the combination of NEXT BITS with a weak address to generate a next weak address for a corresponding refresh rate.
Figure 3C:
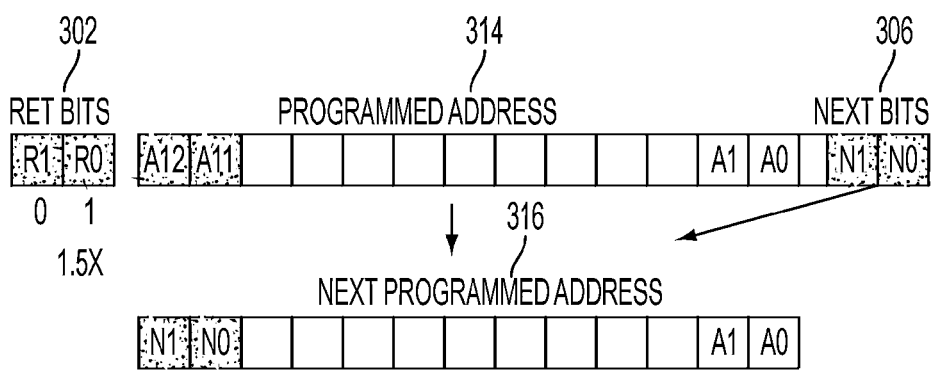

NEXT BITS 306 are defined based on the retention bits. The NEXT BITS 306 are combined with a weak address to generate a next weak address (NEXT_WADD). As shown in FIG. 3B, according to aspect of the present disclosure, a single bit cycle 310 may be used for the NEXT BIT 306 to implement a 2× refresh rate and a two bit NEXT BIT cycle 312 may be used to implement a 1.5× refresh rate. FIG. 3C shows a combination of NEXT BITS 306 with a weak address 314 to generate a next weak address 316 according to an aspect of the present disclosure. The example shown in FIG. 3C is an implementation of a 1.5× refresh rate in which two of the NEXT BITS 306 are used to generate the next weak address 316. To implement a 2× refresh rate, only one of the NEXT BITS 306 is used to generate the next weak address 316 and the second of the NEXT BITS 306 is ignored According to an aspect of the present disclosure, in a 2× refresh cycle, the current single one of the NEXT BITS 306 replaces the most significant bit in a copy of the weak address 314 to generate the next weak address 316. In a 1.5× refresh cycle, the two current ones of the NEXT BITS 306 replace the two most significant bits in a copy of the weak address 314 to generate the next weak address 316.

Figure 4:
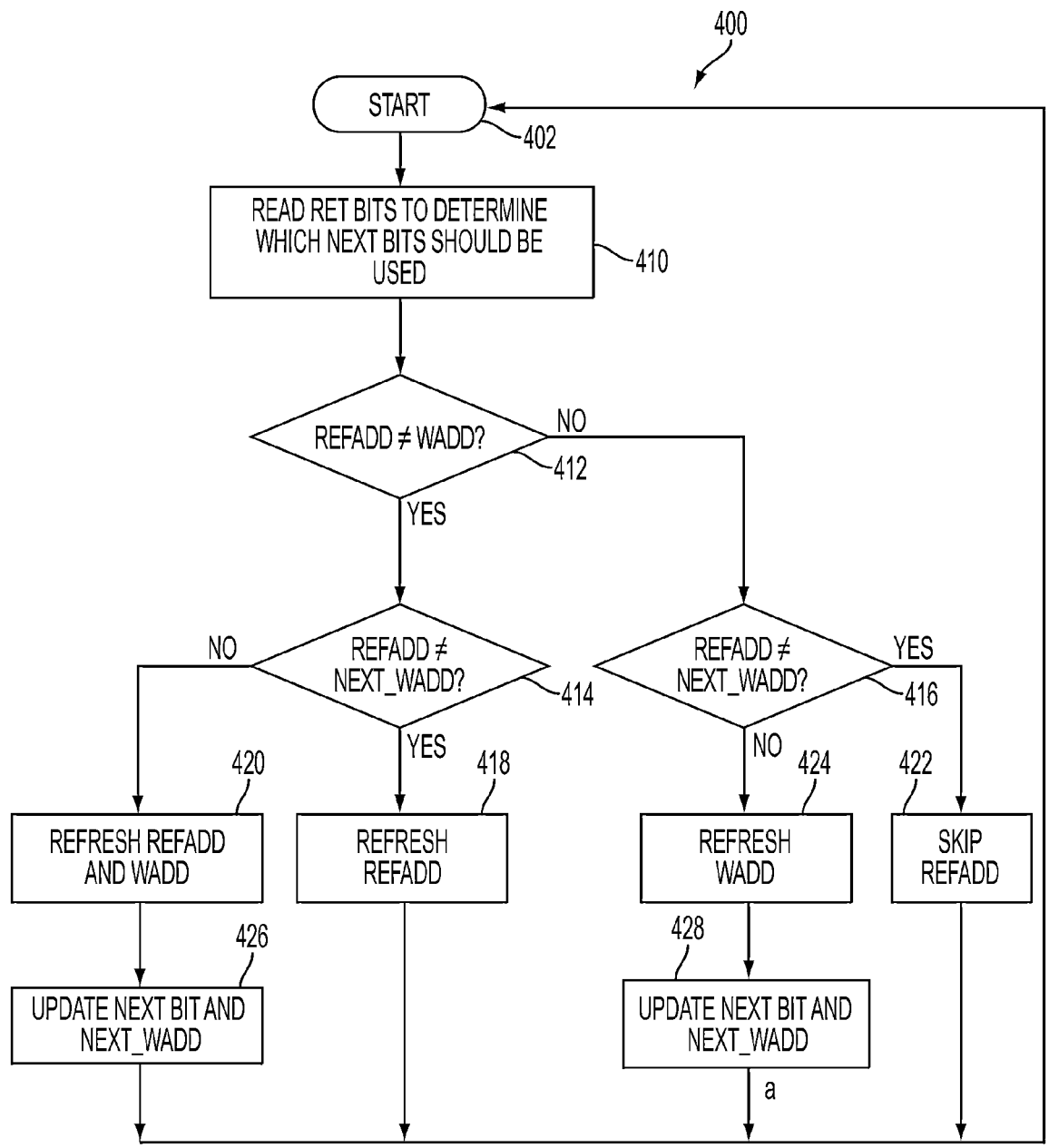
FIG. 4 is a flow chart illustrating a refresh scheme for memory cells with a weak retention state according to another aspect of the present disclosure.

FIG. 4 is a flow chart 400 illustrating a refresh scheme for memory cells with a weak retention state according to an aspect of the present disclosure. At block 410, the retention bits (RET) are read to determine which NEXT BITS should be used. A refresh address (REFADD), a weak row address (WADD) and a next weak row address (NEXT_WADD) are compared in blocks 412-416.

If the refresh address does not equal the weak row address, and the refresh address does not equal the next weak row address then the refresh address is refreshed in block 418 (e.g., first criteria). According to aspects of the present disclosure, if the refresh address does not equal the weak row address, but the refresh address equals the next weak row address then both the refresh address and the weak row address are refreshed in block 420 (e.g., second criteria).

If the refresh address equals the weak row address, but the refresh address does not equal the next weak row address then the refresh address is skipped in block 422 (e.g., third criteria). If the refresh address equals the weak row address, and the refresh address equals the next weak row address then the weak row address is refreshed in block 424 (e.g., fourth criteria). In blocks 426 and 428, after every weak row address refresh, the values of the NEXT BITS (N0, N1) are updated based on the retention bits and the next weak row address is changed based on the NEXT BITS (N0, N1). The refresh cycle is then repeated from the start 402.

Figure 5:
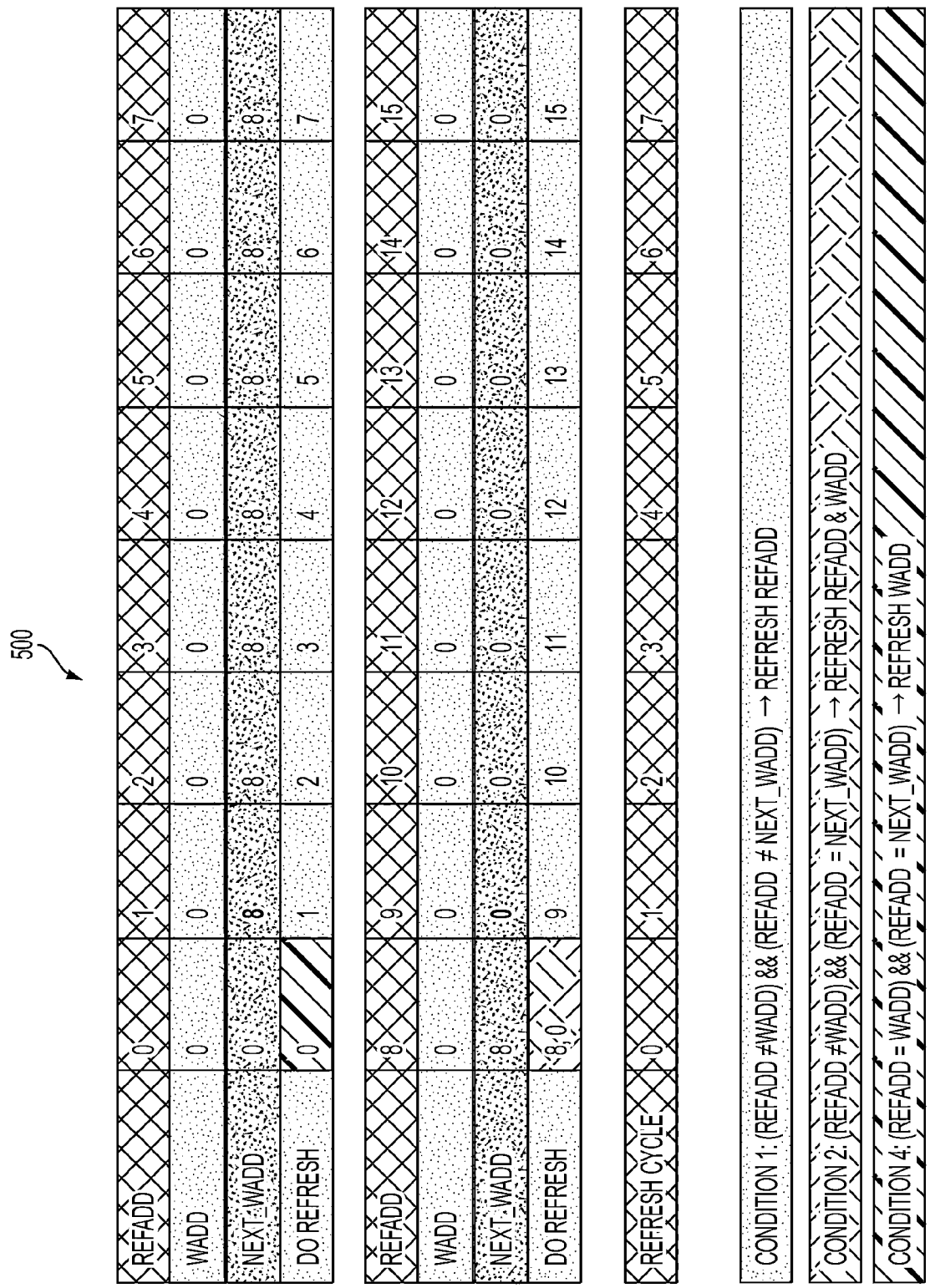
FIG. 5 is a table illustrating an example of a 2× rate refresh cycle according to an aspect of the present disclosure.

FIG. 5 shows a table 500 illustrating an example of a 2× rate refresh cycle according to an aspect of the present disclosure. The table 500 includes values of REFADD, WADD and NEXT_WADD for each cycle of the 2× rate refresh operation. In the example shown in FIG. 5, address row 0 is a weak address. The example refresh sequence is based on refreshing a 16 row memory and cycles from refresh row address 0 to refresh row address 15. For example, it should be understood that practical implementations may include much larger memory having 16K rows or 32K rows (e.g., for DRAMs with more than 8K rows, multiple rows are grouped and refreshed simultaneously, and commonly there are 8K "row groups"; each refresh command refreshes one group). The value of REFADD circulates from 0 to 15 then goes back to zero. In this example, because that there is only one weak row (row 0), the value of WADD is always 0. The NEXT_WADD value is initialized to zero and then changed each time a weak address is refreshed.

In the example shown in FIG. 5, the first refresh cycle (REFADD=0) satisfies the fourth criteria described above, so only WADD is refreshed during the first refresh cycle. After that, the NEXT BIT will be updated and correspondingly the NEXT_WADD is also updated by an amount indicated by the NEXT BIT. In this example, the NEXT_WADD is updated to 8 corresponding to a NEXT BIT value of 1 in the 2× refresh example. Each of the next seven refresh cycles, from REFADD 1 to REFADD=5, satisfy condition 1 so only the normal 1× refresh is conducted.

The ninth refresh cycle (e.g., REFADD=8) satisfies the second criteria described above, so both the normal refresh and the weak row refresh are conducted in the same cycle (e.g., both REFADD=8 and WADD=0 are refreshed). Because WADD has been refreshed in this cycle, the NEXT BIT and correspondingly the NEXT_WADD are updated again. In this example, the NEXT_WADD is updated to 0. Then, for the tenth to the sixteenth refresh cycle (e.g., from REFADD=9 to REFADD=15) only the normal refresh will be conducted to complete one full refresh period of the 16 memory addresses. The refresh sequence is then repeated. The resulting sequence of rows that are refreshed is 0-1-2-3-4-5-6-7-(8 & 0)-9-10-11-12-13-14-15, which shows that the weak row 0 is refreshed twice during the sequence.

Figure 6:
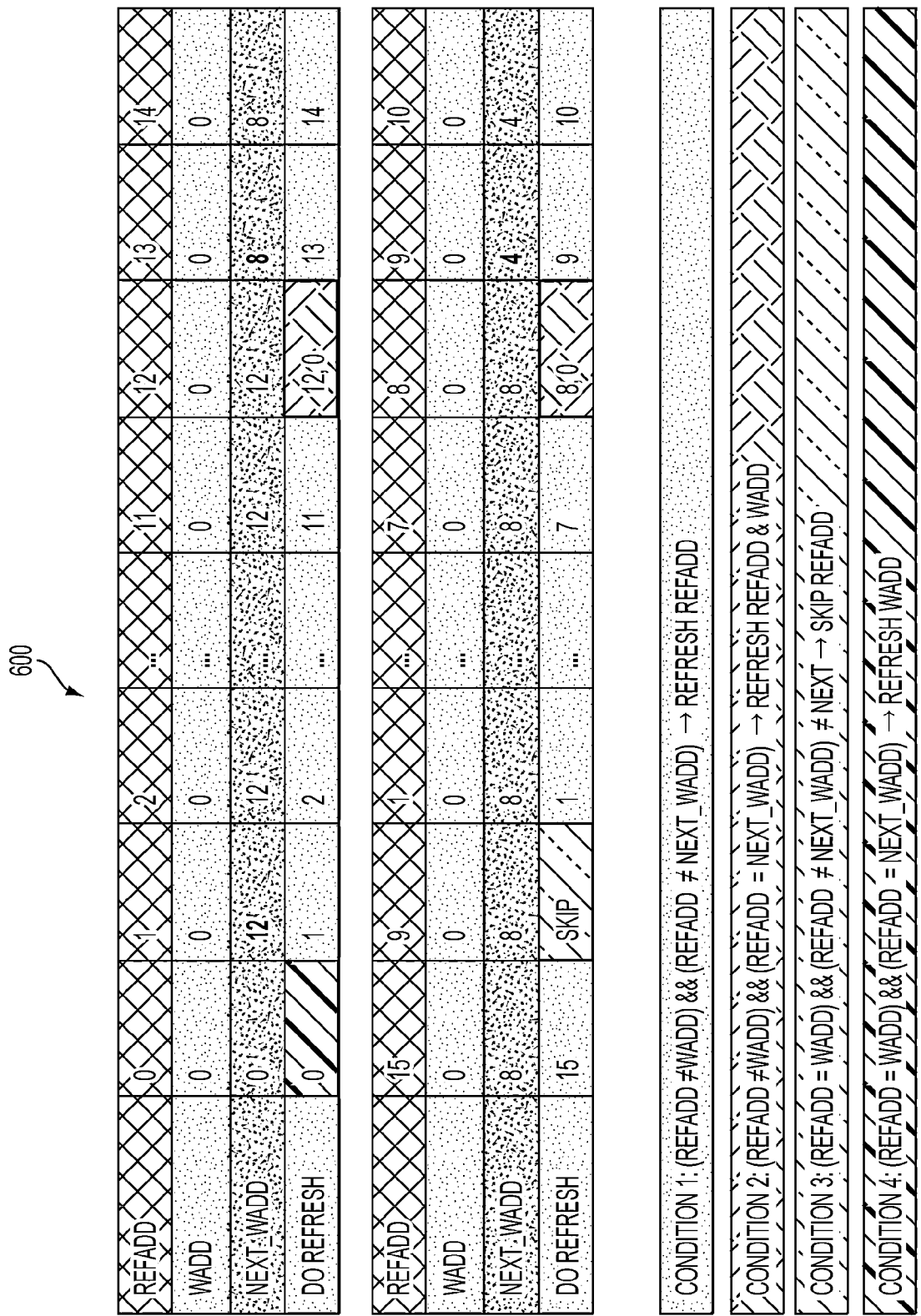
FIG. 6 is a table illustrating an example of a 1.5× rate refresh cycle according to an aspect of the present disclosure.

FIG. 6 shows a table 600 illustrating an example of a 1.5× rate refresh cycle according to an aspect of the present disclosure. The table 600 includes values of REFADD, WADD and NEXT_WADD for each cycle of the 1.5× rate refresh operation. In the example shown in FIG. 6, address row 0 is a weak address. The value of REFADD circulates from 0 to 15 then goes back to zero. In this example, because there is only one weak row (row 0), the value of WADD is always 0. The NEXT_WADD value is initialized to zero and then changed each time a weak address is refreshed.

In the 1.5× refresh rate implementation, according to aspects of the present disclosure, the two NEXT BITS are changed in a pattern from 00-11-10-01 as shown in FIG. 3B. The corresponding NEXT_WADD is changed in a pattern, from 0 to 12, 12 to 8, 8 to 2 and 2 to zero again as described above. In this example, only the weak row refresh is performed in cycle 0 based on the four criteria described above with reference to FIG. 4. Based on the four criteria, in the eleventh refresh cycle (REFADD=12) both the normal refresh (memory row address 12) and the weak row refresh (memory row address 0) are performed again. The twelfth through fourteenth cycle (REFADD=13-REFADD=15) are subject to a normal operation based on the four criteria. For the seventeenth cycle, wherein REFADD=0 in the second round of the refresh sequence, the third criteria is satisfied so the refresh will be skipped. The twenty-fifth cycle in which REFADD=8 in the second round of the refresh sequence, both row 8 and row 0 are refreshed based on the four criteria described above. This example illustrates the weak row being refreshed at a 1.5× refresh rate according to aspects of the present disclosure.

Figure 7A:
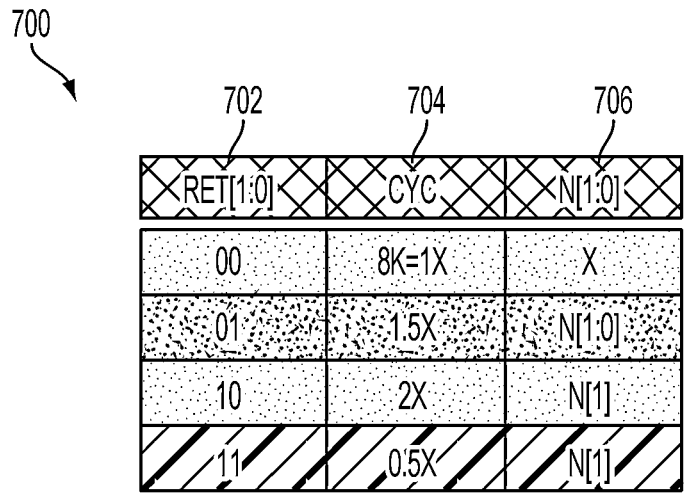
FIG. 7A is a table illustrating the use of retention bits to indicate a corresponding refresh rate and corresponding NEXT BITS for implementing a 0.5× refresh rate for strong memory cells according to an aspect of the present disclosure.

According to another aspect of the present disclosure, a weak row table may also include strong row addresses to facilitate skipping certain refresh cycles for memory addresses that have strong retention. This allows a refresh rate lower than the external 1× refresh rate to be implemented for the strong memory cells. Referring to FIG. 7A, the retention bit values of 11 in a retention bit table 700 may indicate a refresh rate of lower than the external 1× refresh rate for strong rows of memory cells.

FIG. 7A shows a table 700 containing pre-programmed retention bits 702 corresponding to entries in the weak row table 230 (FIG. 2B). The pre-programmed retention bits 702 define the refresh rate 704 to be applied to each respective row listed in the weak row table 230 (FIG. 2B). The pre-programmed retention bits 702 are pre-programmed based on whether a row is a normal row or a weak row and whether the weak row should be subject to a 2× refresh rate protection or a 1.5× refresh rate, for example. In this example of a retention bit table according to aspects of the present disclosure, retention bit values 00 indicate a normal refresh at the external 1× refresh rate; retention bit values of 01 indicate 1.5× refresh rate to be applied to a weak row of memory cells; and retention bit values of 10 indicate 2× refresh rate to be applied to a weak row of memory cells. For example, retention bit values of 11 may indicate that a 0.5× refresh rate is being applied to a corresponding row of strong memory cells.

Figure 7B:
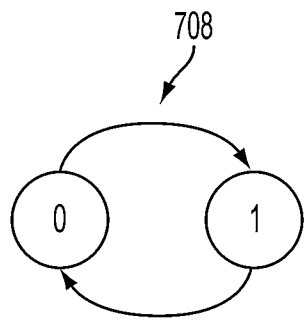
FIGS. 7B and 7C are conceptual diagrams showing the use of NEXT BITS with a strong address to implement a 0.5× refresh rate for strong memory cells according to an aspect of the present disclosure.

NEXT BIT 706 is defined based on the pre-programmed retention bits 702 being set to 11 to implement a 0.5× refresh rate. As shown in FIG. 7B, the utilized NEXT BIT is a single bit (e.g., N1) and the other NEXT BIT (e.g., N0) is ignored when the retention bits are set to 11. When the pre-programmed retention bits 702 are set to 11 to implement a 0.5× refresh rate, the NEXT BIT changes its state after every refresh cycle of the strong row address, regardless of whether the strong row is refreshed during the cycle.

Figure 7C:
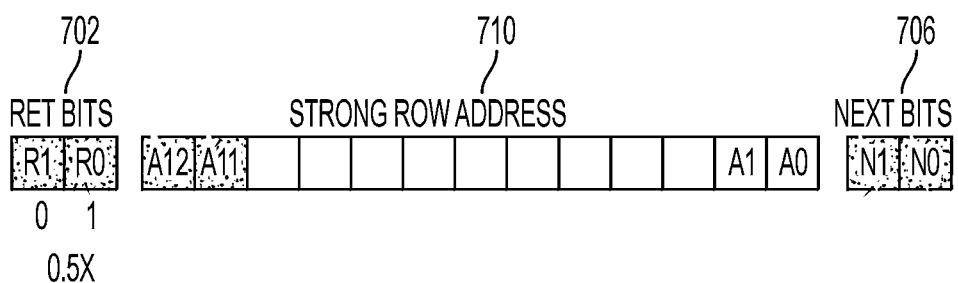

FIG. 7C further illustrates the operation of a strong row refresh according to an aspect of the present disclosure. When the pre-programmed retention bits 702 are set to 11, the corresponding strong row address 710 is refreshed only when the NEXT BIT (N1) 706 is set to 1. After each refresh cycle, the NEXT BIT (N1) 706 is set to 0. This causes alternate refresh cycles to be skipped and thereby implements a 0.5× refresh rate for the strong row address 710. Thus, according to an aspect of the present disclosure, the NEXT BIT 706 is used to alternate between a normal refresh operation in one refresh cycle of a strong address and skipping the next refresh cycle of the strong address.

A memory controller apparatus according to an aspect of the present disclosure includes a refresh counter to store a refresh address, a weak address table to store a weak address, and a next bit table to generate the next weak address based at least in part on next bit values in the next bit table combined with the weak address. The memory controller may include means for selecting between skipping a refresh cycle, refreshing the refresh address, refreshing the weak address, and refreshing both the refresh address and the weak address based at least in part on comparing the refresh address to the weak address and to the next weak address. According to this aspect of the disclosure, the means for selecting may include the refresh control logic 250 shown in FIG. 2A.

The memory controller apparatus may also include means for reading at least one retention bit corresponding to the refresh address, means for determining a refresh rate based on the retention bit, means for determining a next bit sequence based on the retention bit and means for changing the next bit according to the next bit sequence after each refreshing of the weak address. The means for reading the retention bits, determining a refresh rate, determining a next bit sequence and changing the next bit may include the refresh counter 220, the weak row table 230, the NEXT BIT table 240 and the refresh control logic configured as shown in FIG. 2A.

According to an aspect of the present disclosure, the memory control apparatus may also include means for skipping the refresh cycle when the refresh address equals the weak address and does not equal the next weak address, means for refreshing the refresh address when the refresh address does not equal the weak address and does not equal the next weak address, means for refreshing the weak address when the refresh address equals the weak address and equals the next weak address, and means for refreshing both the refresh address and the weak address when the refresh address does not equal the weak address and equals the next weak address. The means for skipping the refresh cycle, means for refreshing the refresh address, means for refreshing the weak address and means for refreshing the refresh address may include the refresh counter 220, the weak row table 230, the NEXT BIT table 240 and the refresh control logic configured as shown in FIG. 2A.

Aspects of memory control systems are presented with reference to various apparatus and methods. These apparatus and methods are described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary configuration, the functions described may be implemented in hardware, software, firmware, or any combination thereof. If implemented in software, the functions may be stored on or encoded as one or more instructions or code on a non-transitory computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Combinations of the above should also be included within the scope of computer-readable media.

Figure 8:
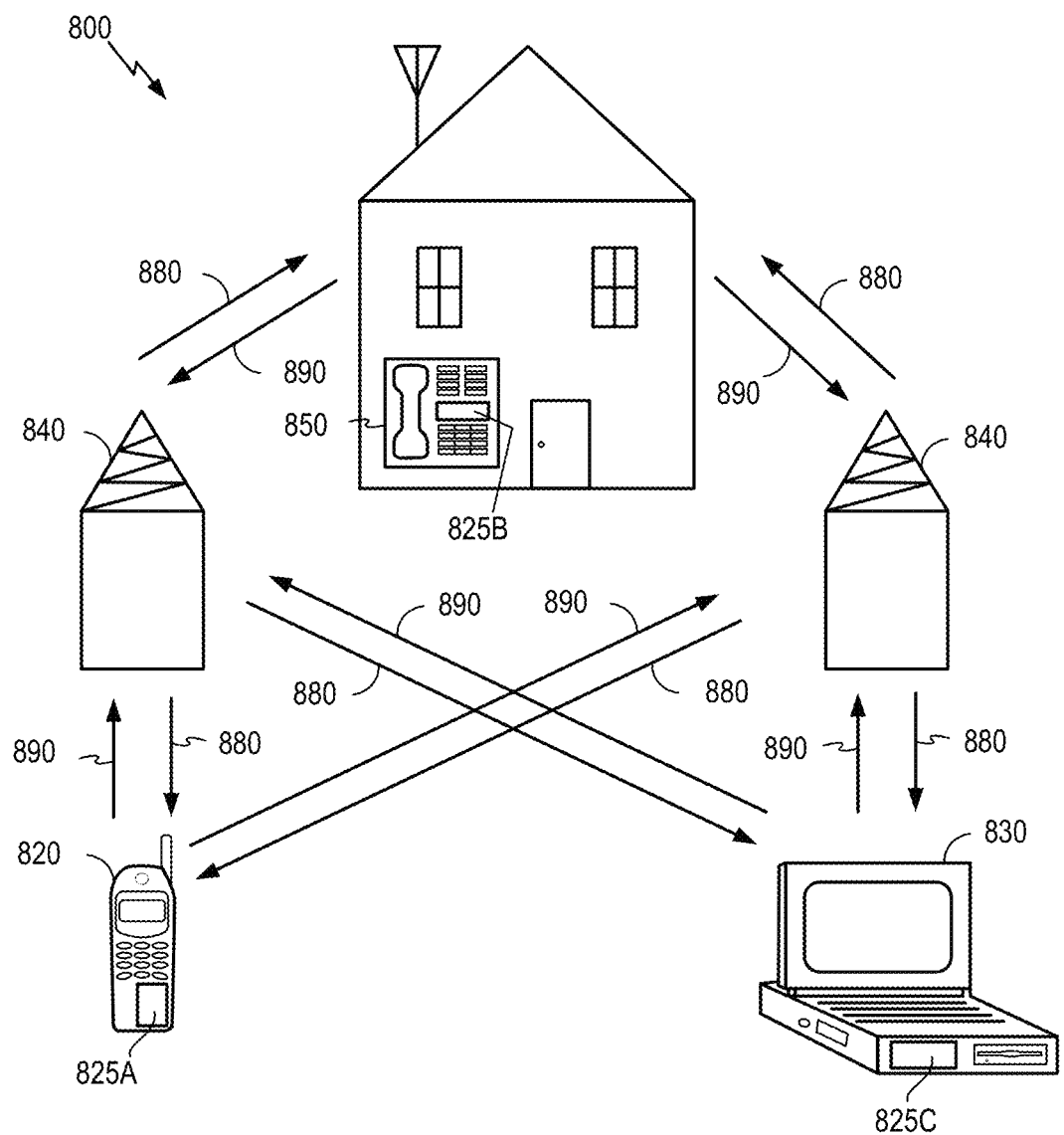
FIG. 8 is a block diagram showing an exemplary wireless communication system in which aspects of the disclosure may be advantageously employed.

FIG. 8 shows an exemplary wireless communication system 800 in which an aspect of the disclosure may be advantageously employed. For purposes of illustration, FIG. 8 shows three remote units 820, 830, and 850 and two base stations 840. It will be recognized that typical wireless communication systems may have many more remote units and base stations. Remote units 820, 830, and 850 include memory controller circuitry 825A, 825B, and 825C, respectively, which are aspects of the disclosure as discussed further below. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 8 illustrates memory controller circuitry according to the teachings of the disclosure, the disclosure is not limited to these exemplary illustrated units. For instance, memory controller circuitry according to aspects of the present disclosure may be suitably employed in any device.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Several processors have been described in connection with various apparatuses and methods. These processors may be implemented using electronic hardware, computer software, or any combination thereof. Whether such processors are implemented as hardware or software will depend upon the particular application and overall design constraints imposed on the system. By way of example, a processor, any portion of a processor, or any combination of processors presented in this disclosure may be implemented with a microprocessor, microcontroller, digital signal processor (DSP), a field-programmable gate array (FPGA), a programmable logic device (PLD), a state machine, gated logic, discrete hardware circuits, and other suitable processing components configured to perform the various functions described throughout this disclosure. The functionality of a processor, any portion of a processor, or any combination of processors presented in this disclosure may be implemented with software being executed by a microprocessor, microcontroller, DSP, or other suitable platform.

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a non-transitory computer-readable medium. A computer-readable medium may include, by way of example, memory such as a magnetic storage device (e.g., hard disk, floppy disk, magnetic strip), an optical disk (e.g., compact disc (CD), digital versatile disc (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, or a removable disk. Although memory is shown separate from the processors in the various aspects presented throughout this disclosure, the memory may be internal to the processors (e.g., cache or register).

Computer-readable media may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

Those of skill in the art would appreciate that the various illustrative blocks, modules, elements, components, methods, and algorithms described herein may be implemented as electronic hardware, computer software, or combinations of both. Furthermore, these may be partitioned differently than what is described. To illustrate this interchangeability of hardware and software, various illustrative sections, blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application.

It is understood that the specific order or hierarchy of steps or blocks in the processes disclosed is an illustration of exemplary approaches. Based upon design preferences, it is understood that the specific order or hierarchy of steps or blocks in the processes may be rearranged. The accompanying method claims present elements of the various steps in a sample order, and are not meant to be limited to the specific order or hierarchy presented.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory refresh method within a memory controller, comprising:
   reading a refresh address from a refresh address counter;
   reading a weak address from a weak address table;
   generating a next weak address value based at least in part on a next bit sequence combined with the weak address;
   comparing the refresh address to the weak address and to the next weak address value; and
   selecting between skipping a refresh cycle, refreshing the refresh address, refreshing the weak address, and refreshing both the refresh address and the weak address based at least in part on the comparing.

2. The method of claim 1, further comprising:
   reading at least one retention bit corresponding to the refresh address;
   determining a refresh rate based on the at least one retention bit.

3. The method of claim 2, further comprising determining the next bit sequence based on the at least one retention bit.

4. The method of claim 3, further comprising changing a next bit according to the next bit sequence after each refreshing of the weak address.

5. The method of claim 1, further comprising:
   skipping the refresh cycle when the refresh address equals the weak address and does not equal the next weak address;
   refreshing the refresh address when the refresh address does not equal the weak address and does not equal the next weak address;
   refreshing the weak address when the refresh address equals the weak address and equals the next weak address; and
   refreshing both the refresh address and the weak address when the refresh address does not equal the weak address and equals the next weak address.

6. The method of claim 1, further comprising:
   reading a strong address from the weak address table; and
   skipping refresh cycles of the strong address.

7. The memory refresh method of claim 1, in which the memory controller is integrated in a mobile phone, a set top box, a music player, a video player, an entertainment unit, a navigation device, a computer, a hand-held personal communication systems (PCS) unit, a portable data unit and/or a fixed location data unit.

8. A memory refresh apparatus, comprising:
   a refresh counter operable to store a refresh address;
   a weak address table operable to store a weak address;
   a next bit table operable to generate a next weak address based at least in part on next bit values in the next bit table combined with the weak address; and
   a refresh controller operable to select between skipping a refresh cycle, refreshing the refresh address, refreshing the weak address, and refreshing both the refresh address and the weak address based at least in part on comparing the refresh address to the weak address and to the next weak address.

9. The memory refresh apparatus of claim 8, in which the refresh controller is further operable to:
   read at least one retention bit corresponding to the refresh address; and
   determine a refresh rate based on the at least one retention bit.

10. The memory refresh apparatus of claim 9, the refresh controller is further operable to determine a next bit sequence based on the at least one retention bit.

11. The memory refresh apparatus of claim 10, the refresh controller is further operable to change a next bit according to the next bit sequence after each refreshing of the weak address.

12. The memory refresh apparatus of claim 8, in which the refresh controller is further operable to:
   skip the refresh cycle when the refresh address equals the weak address and does not equal the next weak address;
   refresh the refresh address when the refresh address does not equal the weak address and does not equal the next weak address;
   refresh the weak address when the refresh address equals the weak address and equals the next weak address; and
   refresh both the refresh address and the weak address when the refresh address does not equal the weak address and equals the next weak address.

13. The memory refresh apparatus of claim 8, in which the refresh controller is further operable to:
   read a strong address from the weak address table; and
   skip refresh cycles of the strong address.

14. The memory refresh apparatus of claim 8 integrated in a mobile phone, a set top box, a music player, a video player, an entertainment unit, a navigation device, a computer, a hand-held personal communication systems (PCS) unit, a portable data unit and/or a fixed location data unit.

15. A memory controller apparatus, comprising:
   a refresh counter to store a refresh address;
   a weak address table to store a weak address;
   a next bit table to generate a next weak address based at least in part on next bit values in the next bit table combined with the weak address; and
   means for selecting between skipping a refresh cycle, refreshing the refresh address, refreshing the weak address, and refreshing both the refresh address and the weak address based at least in part on comparing the refresh address to the weak address and to the next weak address.

16. The memory controller apparatus of claim 15, further comprising:
   means for reading at least one retention bit corresponding to the refresh address;
   means for determining a refresh rate based on the at least one retention bit;
   means for determining a next bit sequence based on the at least one retention bit; and
   means for changing a next bit according to the next bit sequence after each refreshing of the weak address.

17. The memory controller apparatus of claim 15, further comprising:
   means for skipping the refresh cycle when the refresh address equals the weak address and does not equal the next weak address;
   means for refreshing the refresh address when the refresh address does not equal the weak address and does not equal the next weak address;
   means for refreshing the weak address when the refresh address equals the weak address and equals the next weak address; and
   means for refreshing both the refresh address and the weak address when the refresh address does not equal the weak address and equals the next weak address.

18. The memory controller apparatus of claim 15 integrated in a mobile phone, a set top box, a music player, a video player, an entertainment unit, a navigation device, a computer, a hand-held personal communication systems (PCS) unit, a portable data unit and/or a fixed location data unit.

19. A computer program product for a memory refresh comprising:
  a non-transitory computer-readable medium having program code recorded thereon, the program code comprising:
  program code to store a refresh address in a refresh counter;
  program code to store a weak address in a weak address table;
  program code to generate a next weak address based at least in part on next bit values in a next bit table combined with the weak address; and
  program code to select between skipping a refresh cycle, refreshing the refresh address, refreshing the weak address, and refreshing both the refresh address and the weak address based at least in part on comparing the refresh address to the weak address and to the next weak address.

20. The computer program product of claim 19, in which the recorded program code further comprises:
  program code to read at least one retention bit corresponding to the refresh address;
  program code to determine a refresh rate based on the at least one retention bit;
  program code to determine a next bit sequence based on the at least one retention bit; and
  program code to change the next bit according to a next bit sequence after each refreshing of the weak address.

\* \* \* \* \*